(12) United States Patent
Chen et al.

(10) Patent No.: US 7,259,051 B2
(45) Date of Patent: Aug. 21, 2007

(54) METHOD OF FORMING SI TIP BY SINGLE ETCHING PROCESS AND ITS APPLICATION FOR FORMING FLOATING GATE

(75) Inventors: Chih-Ming Chen, Taichung County (TW); Rong-Yuan Hsieh, Hsinchu (TW); Ching-Chi Liu, Hsinchu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 215 days.

(21) Appl. No.: 11/050,963

(22) Filed: Feb. 7, 2005

(65) Prior Publication Data

US 2006/0178011 A1    Aug. 10, 2006

(51) Int. Cl.
*H01L 21/8238* (2006.01)
(52) U.S. Cl. ............ 438/201; 438/211; 438/257; 438/583; 438/FOR. 203; 257/E21.422
(58) Field of Classification Search .......... 438/201, 438/211, 257, 593, FOR. 203; 257/E21.422
See application file for complete search history.

(56) References Cited

U.S. PATENT DOCUMENTS

| | | | |
|---|---|---|---|
| 6,174,818 B1 * | 1/2001 | Tao et al. | 438/733 |
| 6,267,121 B1 * | 7/2001 | Huang et al. | 134/1.1 |
| 6,653,188 B1 * | 11/2003 | Huang et al. | 438/257 |
| 6,759,300 B2 * | 7/2004 | Lay et al. | 438/260 |
| 2006/0084243 A1 * | 4/2006 | Zhang et al. | 438/478 |

* cited by examiner

*Primary Examiner*—Matthew Smith
*Assistant Examiner*—Thanh V. Pham
(74) *Attorney, Agent, or Firm*—Birch, Stewart, Kolasch & Birch, LLP

(57) ABSTRACT

The invention provides a method of forming a silicon tip by a single etching process, as well as a method of forming a tip floating gate to increase erase speed. Etching gases comprising (1) chlorine and/or (2) oxygen/helium are performed to form a silicon tip without bottom dimple. The invention may further control the tip angle by adjusting the etching parameters of gas compositions and ratios, chamber pressures, and radio frequency powers.

12 Claims, 8 Drawing Sheets

METHOD OF FORMING SI TIP BY SINGLE ETCHING PROCESS AND ITS APPLICATION FOR FORMING FLOATING GATE

BACKGROUND

The invention relates to a method of semiconductor manufacturing process, and more particularly to a method of forming a silicon tip by a single etching process, which can be used to form a tip floating gate to increase erase speed.

Flash memory, which has the advantages of nonvolatility, high density, low power consumption, and low cost, has become a major product of the semiconductor industry.

Flash memory, which comprises a control gate used to apply operating voltage and a floating gate used to store charges, performs program or erase operations by applying different voltages of the control gate, source, and drain to move charges on and off the floating gate.

When the edge of the floating gate is a tip, the electrical field is easily concentrated, and the point is easily discharged. If the point discharge is increased, the erasing effect is strong.

U.S. Pat. No. 6,759,300 discloses a method for fabricating a multi-tip floating gate by an anisotropic etching process with gases comprising CF4, CHF3, or a combination thereof, and the tip angle can be controlled by the angle of the anisotropic etching process.

SUMMARY

The invention provides a method of forming a silicon tip without bottom dimple by a single etching process.

The invention also provides a method of forming a tip floating gate by a single etching process to increase erase speed of flash memory devices.

To achieve these and other advantages, the invention comprises : providing a substrate having a silicon layer; putting the substrate into an etching chamber of an etching process tool; and etching the silicon layer to form a tip silicon without bottom dimple by an etching gas comprising (1) chlorine and/or (2) oxygen/helium.

In addition, the invention may further control the tip silicon angles by adjusting the etching parameters of the etching gas compositions and ratios, the etching chamber pressures, and the etching process tool radio frequency (RF) powers.

The invention controls the tip silicon angles easily by adjusting the above etching parameters, which has a simple process not requiring additional process steps, and improves the bottom dimple problem.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings, which are given by way of illustration only, and thus are not limitative of the present invention, and in which.

DETAILED DESCRIPTION OF THE INVENTION

Figure 1A:
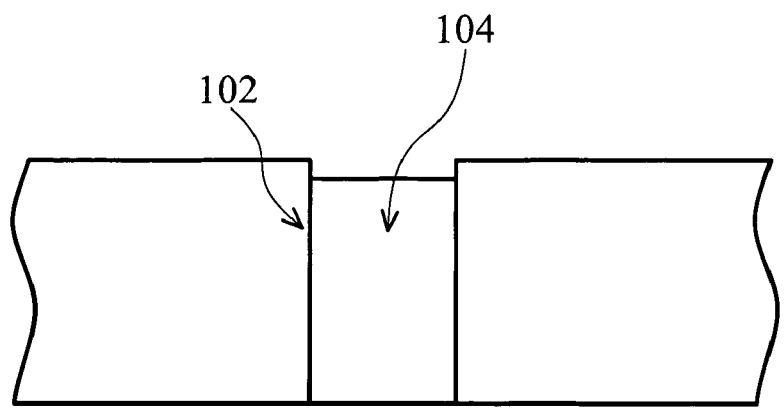
FIGS. 1A and 1B are substrates suitable for the invention.
Figure 1B:
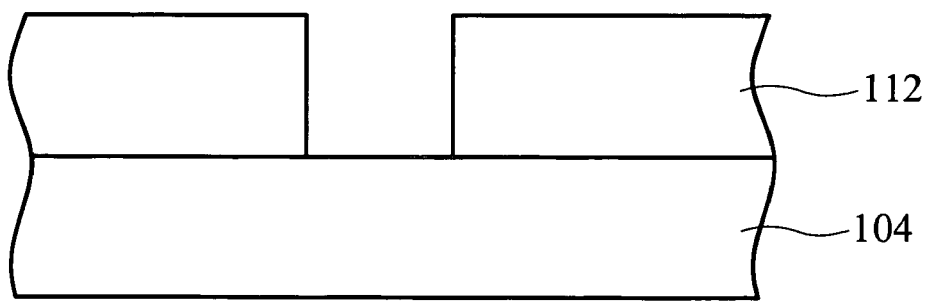

First, a substrate having a silicon layer 104 is provided. The silicon layer 104 may be laid in a trench 102, as shown in FIG. 1A, or disposed under a patterned mask layer 112 with an opening, as shown in FIG. 1B. The silicon layer 104 may comprise polysilicon, epitaxial silicon, single crystal silicon, or doped silicon.

Figure 2:
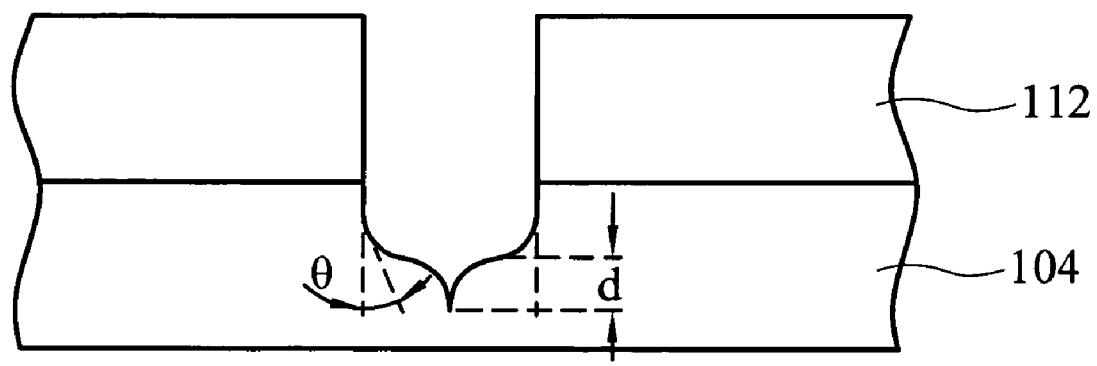
FIG. 2 shows tip angle θ and bottom dimple d.

The invention employs hydrogen bromide (HBr) as a major etching gas in an etcher, such as a transformer-coupled plasma (TCP) etching tool, with suitable amounts of gases (1) chlorine and/or (2) oxygen/helium to form a tip angle θ of the above silicon layer 104 without bottom dimple d. The tip angle θ and bottom dimple d are depicted in FIG. 2. The invention may further control the tip angle θ by adjusting the etching parameters of etching gas compositions and ratios, chamber pressures, and radio frequency (RF) powers.

Below are some examples of the invention, which control the tip angle θ of the silicon layer 104 shown in FIG. 1A, and the silicon layer 104 is polysilicon.

EXAMPLE 1

Effects of Hydrogen Bromide Contents to Polysilicon Tip Angles and Bottom Dimple Depths The top and bottom RF powers of the etching process tool are 600 and 20 watts respectively, the temperature of the bottom RF electrode is 50° C., and the distance between the substrate and the top RF electrode is 5.5 centimeters. Etching gases comprise 20 sccm of chlorine ($Cl_2$), 150 sccm of helium (He), with 50 sccm and 150 sccm of hydrogen bromide (HBr) individually, such that the hydrogen bromide contents are 22.7% and 46.8% respectively. The etching chamber pressure is about 6 mTorr.

Table 1 shows that etching the polysilicon layer by the above 22.7% and 46.8% of hydrogen bromide obtains tip angles θ 55.1° and 45.6° with bottom dimple depths d 320 Å and 480 Å respectively. Table 1 illustrates that while the hydrogen bromide contents increase, the tip angles of polysilicon decrease, and the bottom dimple problem worsens.

TABLE 1

| parameters | | | | | | results | |
| --- | --- | --- | --- | --- | --- | --- | --- |
| HBr (%) | HBr (sccm) | $Cl_2$ (sccm) | He (sccm) | RF powers top/bottom(W) | Chamber pressure(mTorr) | Angle (°) | Dimple (Å) |
| 22.7 | 50 | 20 | 150 | 600/20 | 6 | 55.1 | 320 |
| 46.8 | 150 | 20 | 150 | 600/20 | 6 | 45.6 | 480 |

EXAMPLE 2

Effects of Etching Chamber Pressures to Polysilicon Tip Angles and Bottom Dimple Depths The top and bottom RF powers of the etching process tool are 600 and 20 watts respectively, the temperature of the bottom RF electrode is 50° C., and the distance between the substrate and the top RF electrode is 5.5 centimeters. Etching gases comprise 20 sccm of chlorine, 100 sccm of helium, and 50 sccm of hydrogen bromide. The etching chamber pressures are about 6 and 10 mTorr individually.

Table 2 shows that etching the polysilicon layer by the above 6 mTorr and 10 mTorr of etching chamber pressures obtains tip angles θ 45.7° and 36.80 with bottom dimple depths d 510 Å and 810 Å respectively. Table 2 illustrates that while the etching chamber pressures increase, the tip angles of polysilicon decrease, and the bottom dimple problem becomes worse.

TABLE 2

| parameters | | | | | | results | |
|---|---|---|---|---|---|---|---|
| Chamber pressure(mTorr) | HBr (%) | HBr (sccm) | Cl$_2$ (sccm) | He (sccm) | RF powers top/bottom(W) | Angle (°) | Dimple (Å) |
| 6 | 29.4 | 50 | 20 | 100 | 600/20 | 45.7 | 510 |
| 10 | 29.4 | 50 | 20 | 100 | 600/20 | 36.8 | 810 |

EXAMPLE 3

Effects of RF Powers to Polysilicon Tip Angles and Bottom Dimple Depths

The top RF power of the etching process tool is 600 watts, and the bottom RF powers are 10 and 20 watts respectively. The temperature of the bottom RF electrode is 50° C., and the distance between the substrate and the top RF electrode is 5.5 centimeters. Etching gas comprises 110 sccm of chlorine. The etching chamber pressure is about 4.5 mTorr.

Table 3 shows that etching the polysilicon layer by the above 10 and 20 watts of the bottom RF powers obtains tip angles θ 65.3° and 61.1° with bottom dimple depths d 470 Å and 880 Å respectively. Table 2 illustrates that while the bottom RF powers increase, the ion bombardment effects are enhanced, which increase the etching rates, but cause the bottom dimple problem more significantly.

TABLE 3

| parameters | | | results | |
|---|---|---|---|---|
| RF powers top/bottom(W) | Chamber pressure(mTorr) | HBr (sccm) | Angle (°) | Dimple (Å) |
| 600/10 | 4.5 | 110 | 65.3 | 470 |
| 600/20 | 4.5 | 110 | 61.1 | 880 |

EXAMPLE 4

Effects of Chlorine and Oxygen/Helium to Polysilicon Tip Angles and Bottom Dimple Depths The top and bottom RF powers of the etching process tool are 600 and 20 watts respectively, the temperature of the bottom RF electrode is 50° C., and the distance between the substrate and the top RF electrode is 5.5 centimeters. The etching chamber pressure is about 10 mTorr. Etching gases comprise 200 sccm of hydrogen bromide with 20 sccm of chlorine, and 110 sccm of hydrogen bromide with 18 sccm of a mixture gas oxygen (O$_2$)/helium respectively. The ratio of oxygen to helium of the mixture gas is about 3:7.

Table 4 shows that etching the polysilicon layer by the above chlorine-containing and oxygen/helium-containing etching gases obtains tip angles θ 67.4° and 58.4° respectively without bottom dimple. The etching gas with a small amount of chlorine helps the polysilicon to obtain a more level bottom surface, while the etching gas with a few amount of oxygen/helium mixture gas enhances the etching rate of the polysilicon layer.

TABLE 4

| | parameters | | | | | results | |
|---|---|---|---|---|---|---|---|
| Gas(%) | Cl$_2$ (sccm) | He/O$_2$(7/3) (sccm) | HBr (sccm) | RF powers top/bottom(W) | Pressure (mTorr) | Angle (°) | Dimple (Å) |
| Cl$_2$ 11% | 20 | — | 200 | 600/20 | 10 | 67.4 | No |
| He—O$_2$ 14% | — | 18 | 110 | 600/20 | 10 | 58.4 | No |

It is confirmed by the above examples that the etching parameters of etching gas compositions and ratios, chamber pressures, and RF powers affect the tip angles of polysilicon.

After adjusting the etching parameters such as shown in Table 5, tip angles of 77.5°, 55.4°, and 28.5° without bottom dimple individually are obtained.

TABLE 5

| parameters | | | | | results | |
|---|---|---|---|---|---|---|
| He—O2 (7:3) (sccm) | Cl$_2$ (sccm) | HBr (sccm) | RF powers top/bottom(W) | Pressure (mTorr) | Angle (°) | Dimple (Å) |
| 10 | 30 | 110 | 250/30 | 6 | 77.4 | No |
| 15 | 20 | 70 | 250/20 | 6 | 55.4 | No |
| 10 | 30 | 110 | 600/20 | 6 | 28.5 | No |

Accordingly, it is concluded from the above results that we may obtain a specific tip angle of polysilicon by adjusting etching parameters summarized as below, wherein the etching chamber pressure is below 8 mTorr, the temperature of the bottom RF electrode is 50° C., and the distance between the substrate and the top RF electrode is 5.5 centimeters.

(A) Silicon Tip Angles of 65~85 Degrees:

1. Etching gas comprises 65~80% of hydrogen bromide, 15~25% of chlorine, and 5~8% of oxygen/helium, wherein the ratio of oxygen to helium is about 3:7.

2. The flow rate of the etching gas is about 132~166 sccm.

3. The top RF power of the etching process tool is about 225~275 watts, and the bottom RF power is about 25~35 watts.

(B) Silicon Tip Angles of 45~65 Degrees:

1. Etching gas comprises 61~71% of hydrogen bromide, 14~24% of chlorine, and 12~16% of oxygen/helium, wherein the ratio of oxygen to helium is about 3:7.

2. The flow rate of the etching gas is about 91~116 sccm.

3. The top RF power of the etching process tool is about 225~275 watts, and the bottom RF power is about 15~35 watts.

(C) Silicon Tip Angles of 15~45 Degrees:

1. Etching gas comprises 65~80% of hydrogen bromide, 15~25% of chlorine, and 5~8% of oxygen/helium, wherein the ratio of oxygen to helium is about 3:7.

2. The flow rate of the etching gas is about 132~166 sccm.

3. The top RF power of the etching process tool is about 300~600 watts, and the bottom RF power is about 15~35 watts.

The invention provides a method of forming a silicon tip by a single etching process, which may further control the tip angles by adjusting the etching parameters of gas compositions and ratios, chamber pressures, and RF powers. In addition, the invention also provides a method of forming a tip floating gate to increase erase speed.

A preferred embodiment of the invention is now described with reference to FIGS. 3A through 3F, which illustrate forming a tip floating-gate, as well as how the tip angles may be adjusted according to the invention.

Figure 3A:
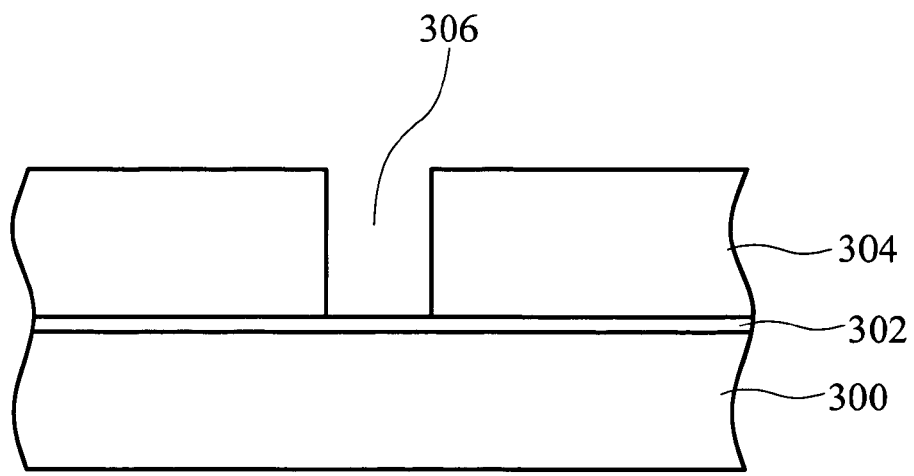
FIGS. 3A through 3F are cross-sections showing an embodiment of forming a tip floating gate according to the invention.

In FIG. 3A, a substrate 300 is provided. A gate dielectric layer 302 such as an oxide layer, and a first dielectric layer 304 such as a silicon nitride layer with trench 306 therein on the substrate 300 is then formed. The trench 306 exposes the top surface of the gate dielectric layer 302.

Figure 3B:
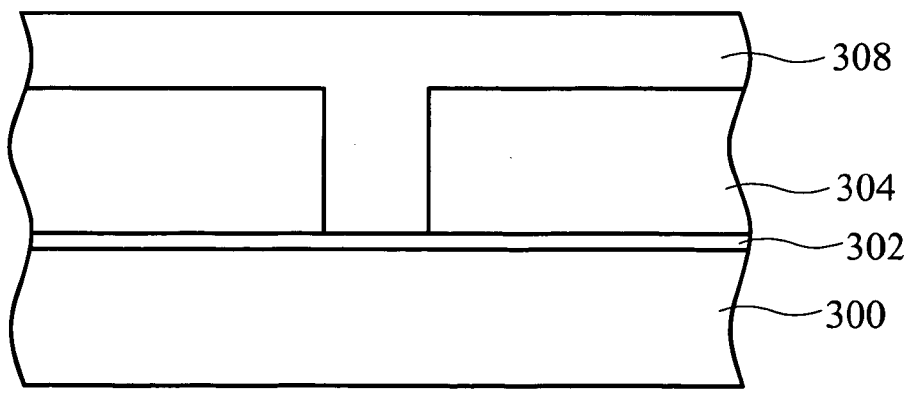

In FIG. 3B, a silicon layer 308 is deposited. The silicon layer 308 may be, but is not limited to, polysilicon, which can further comprise epitaxial silicon, single crystal silicon, or doped silicon.

Next, a CMP process is performed to remove the silicon layer 308 until the top surface of the first dielectric layer 304 is exposed, and/or an etch-back process to remove the silicon layer 308 to a level below the top surface of the first dielectric layer 304 in the trench 306. The first dielectric layer 304 may preferably have a high etch and/or polish selectivities relative to the silicon layer 308.

Figure 3C:
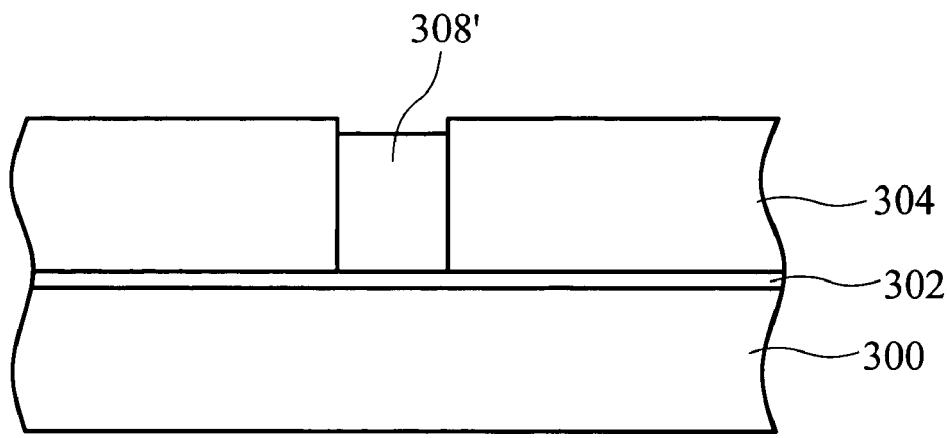

As shown in FIG. 3C, the above polished or etched silicon layer 308' may be at a level close to or below the top surface of the first dielectric layer 304.

Figure 3D:
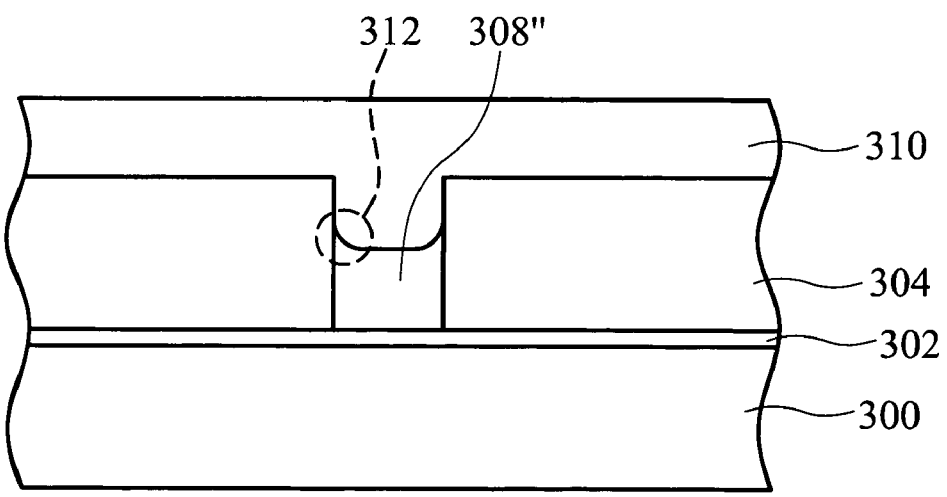

Then, etching the silicon layer 308' to become a silicon layer 308" having a tip 312 without the described bottom dimple problem, as shown in FIG. 3D. The silicon layer 308" will be formed as a floating gate in subsequent processes, and the tip 312 angles may be controlled by the invention. Next, a second dielectric layer 310 such as an oxide is deposited, which may preferably have a high etch selectivity relative to the first dielectric layer 304.

Figure 3E:
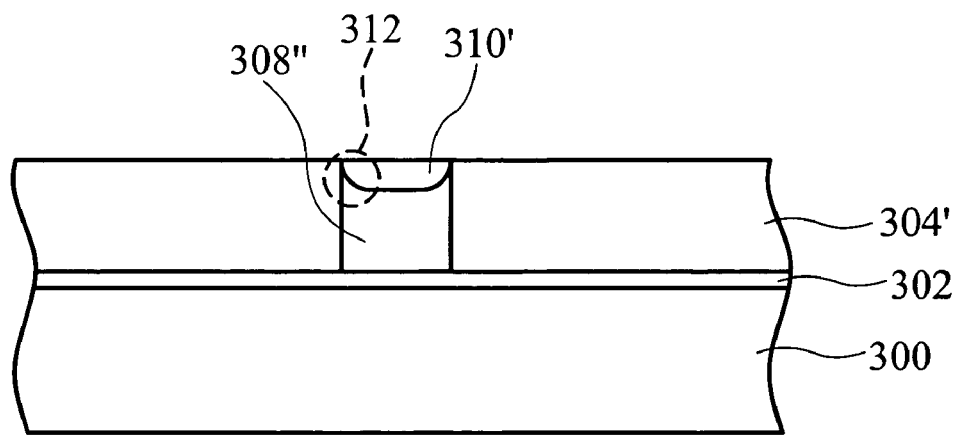

In FIG. 3E, performing a CMP process to remove the second dielectric layer 310 until the top surface of the first dielectric layer 304 is exposed, or further polishing the dielectric layer 310 and 304 to form the first dielectric layer 304' and second dielectric layer 310', which are preferably above the silicon tip 312.

Figure 3F:
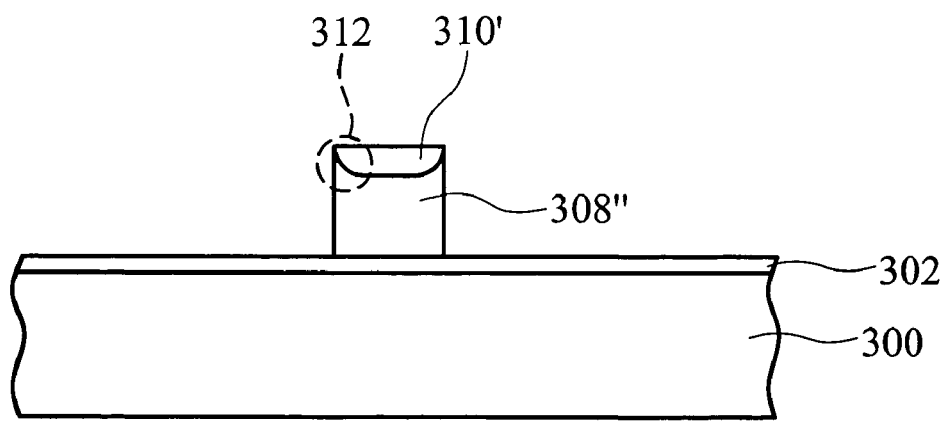

Next, the first dielectric layer 304' is removed to form a structure such as shown in FIG. 3F, wherein the silicon layer 308" with the tip 312 acts as a floating gate, and the tip 312 angles may be controlled by adjusting the above etching parameters according to the invention. Etching gases comprising (1) chlorine and/or (2) oxygen/helium avoid the described bottom dimple problem.

Another embodiment of the invention is described with reference to FIGS. 4A through 4F, which illustrate forming a tip floating gate, as well as how the tip angles may be adjusted according to the invention.

Figure 4A:
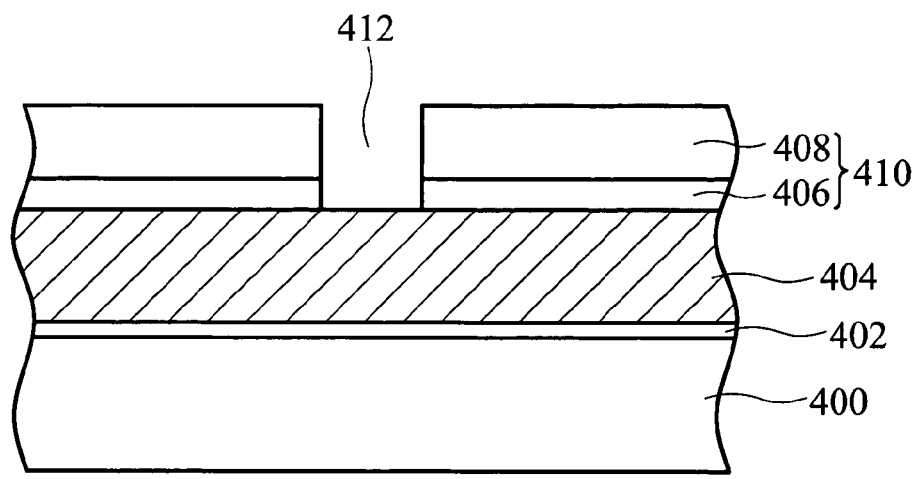
FIGS. 4A through 4F are cross-sections showing another embodiment of forming a tip floating gate according to the invention.

In FIG. 4A, a substrate 400 is provided. A gate dielectric layer 402, a silicon layer 404, and a patterned mask layer 410 with an opening 412 are subsequently formed on the substrate 400, wherein the opening 412 exposes the top surface of the silicon layer 404. The gate dielectric layer 402 may be an oxide, and the silicon layer 404 may be, but is not limited to, polysilicon, which may further comprise epitaxial silicon, single crystal silicon, or doped silicon. The patterned mask layer 410 may comprise an etch mask 408 such as a photoresist layer, and an optional insulating layer 406 such as a silicon nitride disposed between the silicon layer 404 and the etch mask 408.

Figure 4B:
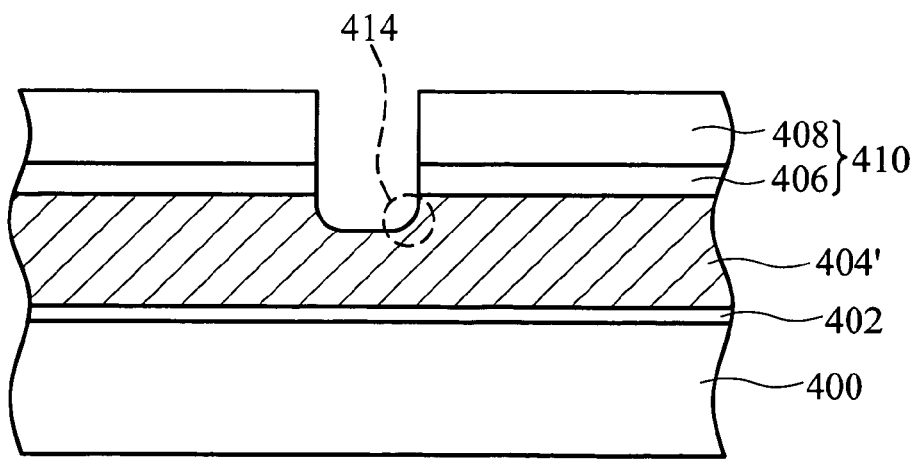

In FIG. 4B, etching the silicon layer 404 to become a silicon layer 404' having a rounded-corner 414 without a bottom dimple by the invention.

Figure 4C:
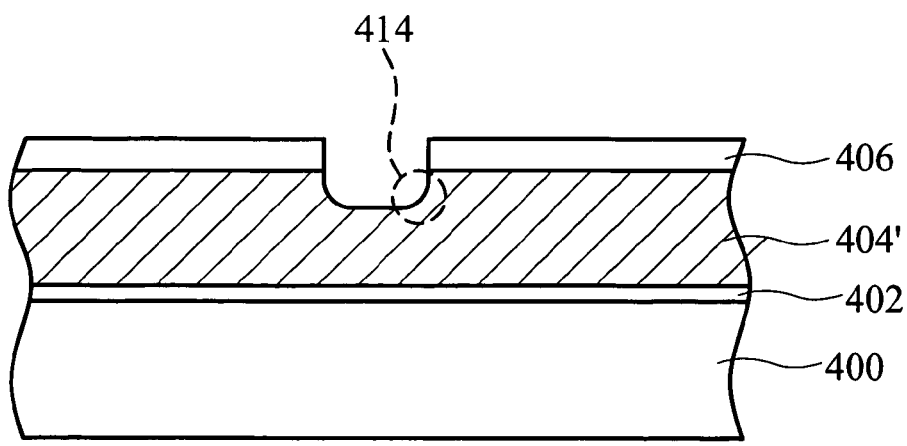
Figure 4D:
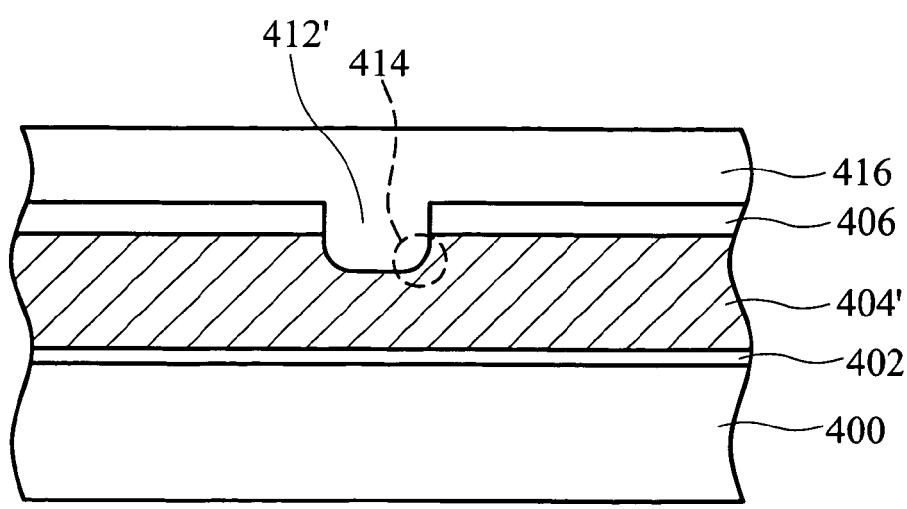

Removing the etch mask 408, as shown in FIG. 4C. Next, depositing a first dielectric layer 416 to fill the trench 412', as shown in FIG. 4D. The first dielectric layer 416 may comprise an oxide layer or fluorinated silicate glass (FSG) layer, which may preferably have a high etch and/or polish selectivities relative to the silicon layer 404 and insulating layer 406.

Figure 4E:
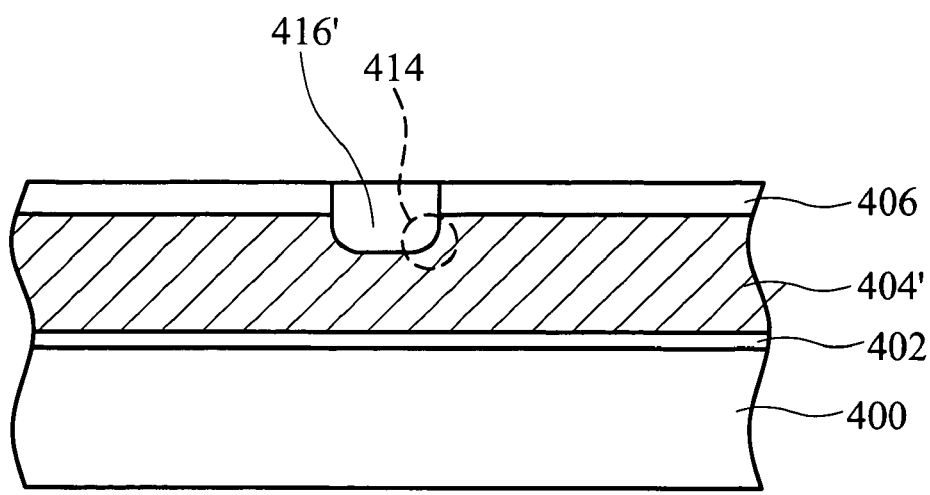

The first dielectric layer 416 is then planarized down to the top surface of the insulating layer 406, leaving a residual first dielectric layer 416', as shown in FIG. 4E.

Figure 4F:
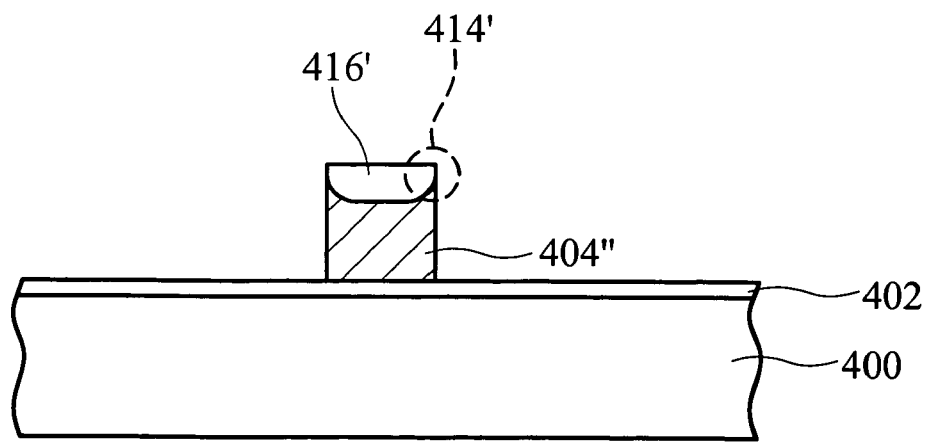

Removing the insulating layer 406 to expose the silicon layer 404', followed by anisotropically etching the exposed silicon layer 404' using the residual first dielectric layer 416' as an etching mask, forming a silicon layer 404" to serve as a floating gate, as shown in FIG. 4F. The tip angle 414' of the silicon layer 404" may be controlled by the invention. In addition, etching gases comprising (1) chlorine and/or (2) oxygen/helium avoid bottom dimple problem.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a floating gate, comprising:
   providing a substrate;
   forming a gate dielectric layer on the substrate;
   forming a first dielectric layer with a trench therein, the trench exposing a top surface of the gate dielectric layer;
   filling a silicon layer in the trench;
   putting the above substrate into an etching chamber of an etching process tool;
   etching portions of the silicon layer to form a tip edge by an etching process comprising hydrogen bromide as a major etching gas with suitable amounts of gases (1) chlorine and/or (2) oxygen/helium, wherein the tip edge angle is controlled by the adjusting the etching parameters of the etching gas compositions and ratios, the etching chamber pressures, and the etching process tool radio frequency powers;
   forming a second dielectric layer overlying the silicon layer with a tip in the trench; and
   selectively removing the first dielectric layer to leave the silicon layer covered by the second dielectric layer as a floating gate.

2. The method as claimed in claim 1, wherein the silicon layer comprises polysilicon, epitaxial silicon, single crystal silicon, or doped silicon.

3. The method as claimed in claim 1, wherein the etching chamber pressures are less than 8 mTorr.

4. The method as claimed in claim 3, wherein the tip edge angles are between 15~45 degrees.

5. The method as claimed in claim 4, wherein the etching gas comprises 65~80% of hydrogen bromide, 15~25% of chlorine, as well as 5~8% of oxygen/helium, wherein the ratio of oxygen to helium is about 3:7; and the flow rate of the etching gas is about 132~166 sccm.

6. The method as claimed in claim 5, wherein the etching process tool radio frequency powers comprise a top radio frequency power of about 300~600 watts, and a bottom radio frequency power of about 15~35 watts.

7. The method as claimed in claim 3, wherein the tip edge angles are between 45~65 degrees.

8. The method as claimed in claim 7, wherein the etching gas comprises 61~71% of hydrogen bromide, 14~24% of chlorine, as well as 12~16% of oxygen/helium, wherein the ratio of oxygen to helium is about 3:7; and the flow rate of the etching gas is about 91~116 sccm.

9. The method as claimed in claim 8, wherein the etching process tool radio frequency powers comprise a top radio frequency power of about 225~275 watts, and a bottom radio frequency power of about 15~35 watts.

10. The method as claimed in claim 1, wherein the tip edge angles are between 65~85 degrees.

11. The method as claimed in claim 10, wherein the etching gas comprises 65~80% of hydrogen bromide, 15~25% of chlorine, as well as 5~8% of oxygen/helium, wherein the ratio of oxygen to helium is about 3:7; and the flow rate of the etching gas is about 132~166 sccm.

12. The method as claimed in claim 11, wherein the etching process tool radio frequency powers comprise a top radio frequency power of about 225~275 watts, and a bottom radio frequency power of about 25~35 watts.

* * * * *